United States Patent
Lin et al.

(10) Patent No.: US 6,933,522 B2
(45) Date of Patent: Aug. 23, 2005

(54) ORGANIC ELECTROLUMINESCENT DEVICE AND METHOD FOR PRODUCING THE SAME

(75) Inventors: Ming-Der Lin, Hsinchu (TW); Feng-Ju Chuang, Hsinchu (TW); Jwo-Huei Jou, Hsinchu (TW); Yen-Shih Huang, Fengyuan (TW)

(73) Assignee: Opto Tech Corporation, Hsinchu (TW)

( * ) Notice: Subject to any disclaimer, the term of this patent is extended or adjusted under 35 U.S.C. 154(b) by 160 days.

(21) Appl. No.: 10/657,170

(22) Filed: Sep. 9, 2003

(65) Prior Publication Data

US 2004/0104394 A1 Jun. 3, 2004

(30) Foreign Application Priority Data

Sep. 11, 2002 (TW) ........................ 91120668 A

(51) Int. Cl.⁷ ............................. H01L 25/24; H01J 1/62
(52) U.S. Cl. ...................... 257/40; 257/98; 257/103; 313/509; 313/500
(58) Field of Search ...................... 257/40, 98, 103; 438/82, 99, 22, 25; 313/509, 500, 503, 506

(56) References Cited

U.S. PATENT DOCUMENTS

2003/0178619 A1 * 9/2003 Forrest et al. ............... 257/40

* cited by examiner

Primary Examiner—David Nelms
Assistant Examiner—Long Tran
(74) Attorney, Agent, or Firm—Rosenberg, Klein & Lee

(57) ABSTRACT

An organic electroluminescent device with the feature of three-wavelength luminescence is provided. The device includes a hole transporting layer, an electron blocking layer, a first host material layer, a second host material layer, a hole blocking layer, and an electron transporting layer placed between an anode and a cathode in turn. In which, the first host material layer has a first guest luminous substance mixed therein for projecting a first color light source (B), while the second host material layer correspondingly has a second guest luminous substance and a third guest luminous substance mixed therein for projecting a second color light source (G) and a third color light source (R), respectively, under the effect of an external bias voltage, wherein said second guest luminous substance or said third guest luminous substance may be a phosphorescence substance. Thus, not only a continuously full-band, full-colored light source featuring three-wavelength may be acquired directly by means of the combination of RGB colors, but also an effective utilization of phosphorescence substance and thus significantly raised luminescence efficiency may be obtained.

24 Claims, 4 Drawing Sheets

ORGANIC ELECTROLUMINESCENT DEVICE AND METHOD FOR PRODUCING THE SAME

FIELD OF THE INVENTION

The present invention is related to a light-emitting device, particularly to an organic electroluminescent device with the feature of white light emitted by three-wavelength and a method for producing the same.

BACKGROUND

An organic electroluminescent device (OLED), presented by C. W. Tang and S. A. VanSlyke, Kodak Company in 1987, is made by vacuum vapor deposition method for depositing a hole-transporting material and an electron-transporting material, such as Alq3, onto a light-transparent indium-tin oxide (ITO) glass, respectively, and then vapor depositing a metal electrode, to form an organic electroluminescent device (OLED) with self-luminescence, fast response speed, light weight, thin thickness, low power consumption, large view angle, high brightness, and full-coloredness. Thereafter, the organic electroluminescent device has been considered as a star product in the monitor industry or to project white light by all circles, in order to achieve an ideal state of illumination considering functions of both environment protection and energy saving.

Referring to FIG. 1, there is shown a structural cross-section view of a conventional OLED, as demonstrated in U.S. Pat. No. 4,769,292, entitled "ELECTROLUMINESCENT DEVICE WITH MODIFIED THIN FILM LUMINESCENT ZONE", disclosed in 1988, by Eastman Kodak Company, U.S.A. The organic electroluminescent device (OLED) 10 is essentially formed, by vapor deposition, with a light-transparent conductive anode (ITO) 13 onto a light-transparent substrate 11, and a hole transporting layer (HTL) 15, an emitting layer (EML) 17, as well as a metal cathode 19 may be formed onto the ITO anode 13 in turn. Additionally, a fluorescence substance (not shown) is doped into the emitting layer 17. As an external bias voltage is applied to the anode 13 and cathode 19, the hole may be transported to the emitting layer 15 from the anode 13 through the hole transporting layer 15, and the electron may be also transported to the emitting layer 17 from the cathode 19, correspondingly. An exciton may be generated from the electron and hole in the emitting layer 17 by recombination. Once the energy is released and the excition may be thus returned to the ground state thereof, light is emitted within the emitting layer 17 by itself, or subsequently the doped fluorescence substance is excited to excitation state and then the light source with a pre-specified wavelength region will be projected.

The projection light source may be obtained via the structure and technology of the first conventional OLED described above, however, only a monochromatic light could be projected, and the final object of projecting white light of full-coloredness could not be achieved.

Moreover, although light in the organic electroluminescent device may be presented as two types including singlet fluorescence and triplet phosphorescence, most of the guest luminous substances in the conventional organic electroluminescent device may be adapted to utilize the fluorescent dye substance of the former, and ignoring the latter, due to the physical characteristics that the exciton of the triplet phosphorescence could not be radiatively released, that the luminescence thereof is slow and insufficient, that the triplet energy transfer originated from the conductive host material layer to the guest luminous substance is slower than the singlet one, and that the luminescence efficiency of the triplet phosphorescence my be decreased rapidly under the high-density current. However, in all excitons, 75% of the energy is provided by the triplet, and only remaining 25% of the energy is provided by the singlet. This means that the most part of the energy, i.e., the former one, will be ignored, such that the overall luminescence efficiency may be-affected significantly.

In order to utilize the triplet phosphorescence substance, a second conventional organic electroluminescent device has been developed, such as U.S. Pat. No. 6,310,360, entitled "INTERSYSTEM CROSSING AGENTS FOR EFFICIENT UTILIZATION OF EXCITONS IN ORGANIC LIGHT EMITTING DEVICES", disclosed by Princeton University and University of Southern California. As illustrated in FIG. 2, the essential structure comprises, grown onto a glass substrate 21, an ITO anode 23, TPD hole transporting layer 25 (HTL), CBP emitting layer 26 (EMP), BCP exciton blocking layer 28, Alq 3 electron transporting layer 27 (ETL), cathode 29 and protecting layer 295 in turn, in which the emitting layer 26 is further divided into a first emitting layer 261 doped with DCM 2 (fluorescent material) and a second emitting layer 262 doped with Ir (PPy) 3 (phosphor material), as well as these two layers may be continuously stacked to form an interlaced layer. When an external bias voltage is presented between the anode 23 and cathode 29, the Ir (PPy) 3 will be served as an intersystem crossing agent to cross the singlet and triplet, such that a larger amount of the triplet exciton energy may be transferred to the singlet exciton one, and the object of non-wasting triplet and effectively raising overall luminescence efficiency may be obtained accordingly.

The performance of effectively utilizing triplet exciton and raising luminescence efficiency may be achieved in the aforementioned patent technology; however, the projection light source is composed of two wavelengths, as illustrated in FIG. 3, essentially including green light generated from Ir (PPy) 3 and red light generated from DCM 2. In other words, it is a spectrum diagram formed by two wavelengths. As such, if the white light source or full-colored product requirement is necessary, not only the uncontinuous light source, but also light color uneveness or color bias phenomenon (green bias or red bias) may be liable to occur, thus, not suitable for being the choice for white light source or full colored product.

Moreover, for achieving the final object of applying the OLED to the white light source and full-coloredness, generally, three approaches presently utilized by the industry may be as follows: color conversion, colored filter film, and RGB independently luminescence method. However, disadvantages of light uneveness or color bias phenomenon, how to get the white light source and raise the luminescence efficiency, and difficulty in obtaining pure color from the red source as well as shorter service life may be presented in the aforementioned approaches, respectively. In particular, all of them are pertained to two-wavelength luminescence approach, thus not suitable for the white light source and full-colored product requirement.

Thereby, for the problems and imperfections of the aforementioned conventional organic electroluminescent device, there is proposed a solution with three-wavelength projection source for achieving the best distribution of full-colored light source and readily accomplishing the final object of white light and full-colored.

SUMMARY OF THE INVENTION

Accordingly, it is a primary object of the present invention to provide an organic electroluminescent device capable of obtaining the best even distribution of light color so as to readily achieve the final product requirement for white light and full-coloredness by means of three-wavelength projection light source.

It is a secondary object of the present invention to provide an organic electroluminescent device capable of solving the drawback with respect to the production of white light source or full-colored product for a ling time.

It is another object of the present invention to provide an organic electroluminescent device for effectively raising luminescence efficiency and service life by cooperating the host material with and guest luminous substance.

It is still another object of the present invention to provide an organic electroluminescent device being not only non-wasting the triplet exciton but also raising luminescence efficiency by means of effectively utilizing the triplet exciton with the most significant percentage.

DETAILED DESCRIPTION

Figure 1:
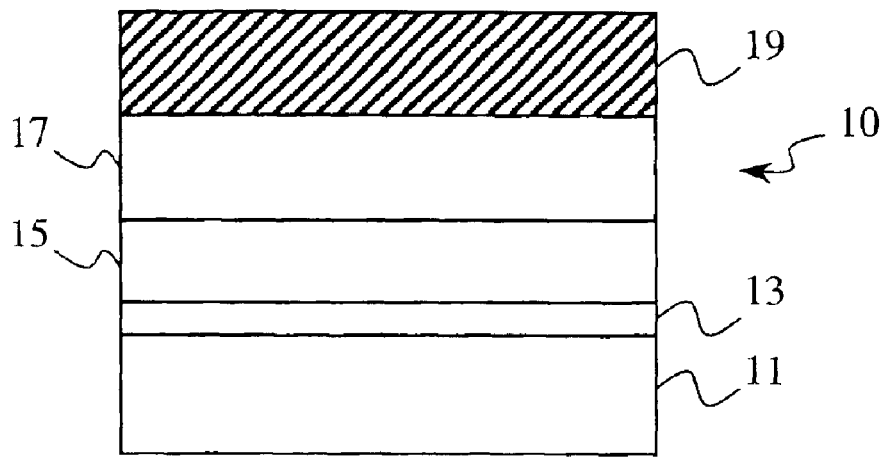
FIG. 1 is a structural cross-section view of a conventional organic electroluminescent device.
Figure 2:
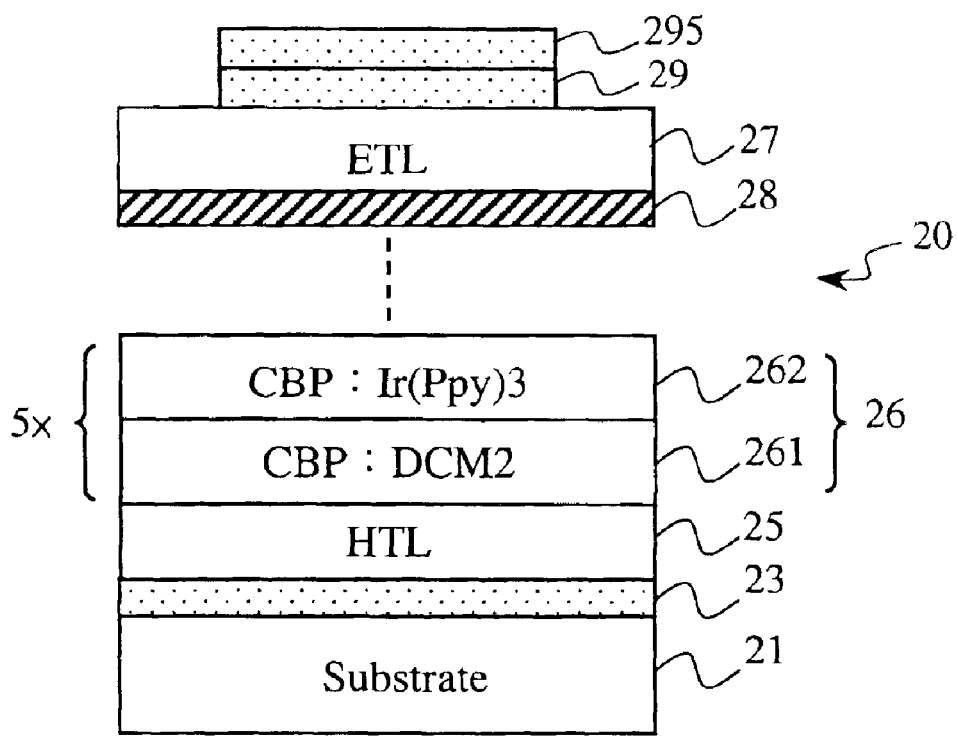
FIG. 2 is a structural cross-section view of another conventional organic electroluminescent device.
Figure 3:
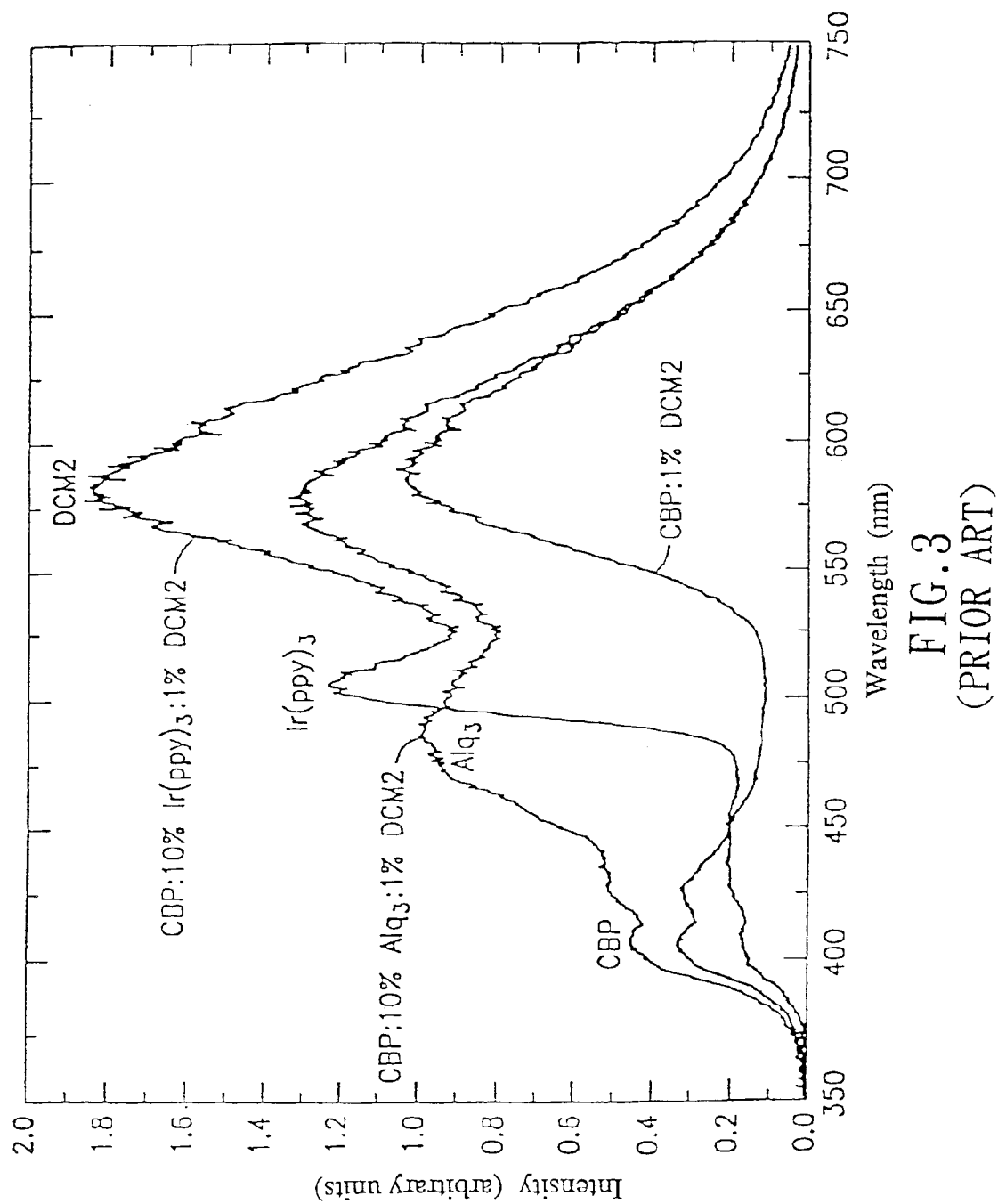
FIG. 3 is a spectrum diagram of the conventional organic electroluminescent device illustrated in FIG. 2.
Figure 4:
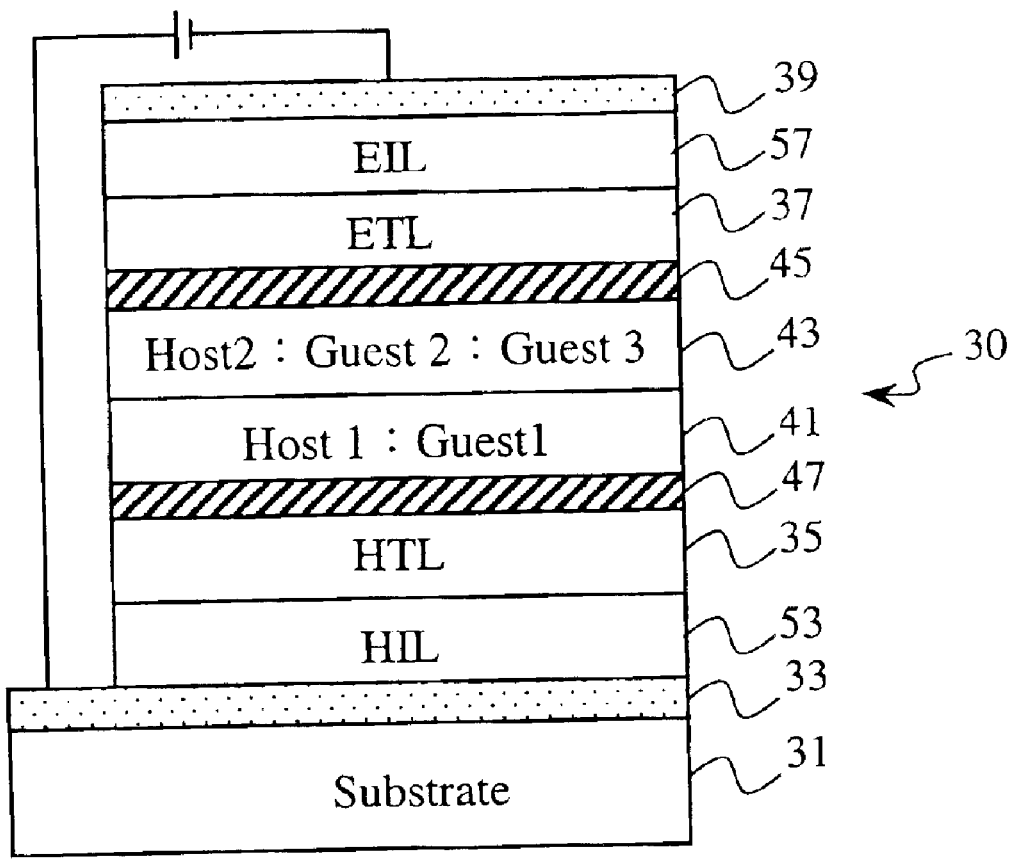
FIG. 4 is a structural cross-section view of an organic electroluminescent device according to one embodiment of the present invention.

Firstly, referring to FIG. 4, there is shown a structural cross-section view of one embodiment of the present invention. As illustrated in this figure, an organic electroluminescent device 30 of the present invention essentially comprising forming a first conductive layer 33 (for example, anode) onto the top side of a light-transparent substrate 31 by vapor deposition, sputtering deposition, and so on, Subsequently, onto the top side of the anode 33, there may be formed with, in turn, a hole injecting layer 53 (HIL; first carrier injecting layer), a hole transporting layer 35 (HTL; first carrier transporting layer), and an electron blocking layer 47 for blocking the second carrier (electron) to proceed. Onto the top side of the electron blocking layer 47, there may be then further formed with, in turn, a first host material layer 41 (Host 1) and a second host material layer 43 (Host 2), and the top side of the second host material layer 43 may be further formed with a hole blocking layer 45 for blocking hole (first carrier) to proceed, an electron transporting layer 37 (ETL; second carrier transporting layer), an electron injection layer 57 (EIL; second carrier injection layer), and a cathode 39.

The electron originated from the cathode 39 may be blocked at the top side of the hole transporting layer 35 by means of the electron blocking layer 47, in other words, the electrons are restricted within the Host 2 (43) and Host 1 (41); moreover, the holes originated from the anode 33 may be blocked at the bottom side of the electron transporting layer 37 by means of the hole blocking layer 45, in other words, the holes are equally restricted within the Host 1 (41) and Host 2 (43). Since most of the electrons and holes are led to and restricted within the region of the Host 1 and Host 2, the recombination of electron-hole pair may occur within respective host materials with relatively high probability, whereby, an effectively increased luminescence efficiency of respective host material layers may be obtained.

A first guest luminous substance (Guest 1) is mixed into the first host material layer 41, and a corresponding second (Guest 2) and third (Guest 3) luminous substances are also mixed into the second host material layer 43. All of these guest luminous substances are selected from the fluorescence substance, the phosphorescence substance, or the mixture thereof, and needed to be coordinated correspondingly, in order for projecting light with correspondingly different colors, when the recombination of electron with hole is performed to release the energy of exciton. In this embodiment, for instance, blue light (B) may be projected by the Guest 1, green light (G) may be projected by Guest 2, and red light (R) may be projected by Guest 3. In this case, RGB colors in three-band of are thus generated, and then combined to form a full-band continuous spectrum as a white light source or full-colored product. Not only a relatively simple manufacturing process, but also effectively increased luminescence efficiency may be obtained.

It is also possible, of course, to form the second host material layer 43 mixed with the Guest 2 and Guest 3 at the top side of the hole transporting layer 35 firstly, and subsequently form the first host material layer 41 mixed with the Guest 1 at the top side of the second host material layer 43. As such, a second color light source, a third color light source, and a first color light source are equally generated successfully if an external bias voltage is applied, such that a combined three-wavelength projection light source may be accomplished. Thus, the up/down order between the Host 1 and the Host 2 is not absolute, only coordination between energy levels is required.

Furthermore, in an experimental result of the present invention, there is essentially formed with the anode 33, composed of a light-transparent conductive substance, such as indium-tin oxide (ITO), for example, onto the light-transparent substrate 31 made of glass, quartz, or plastic, by means of vapor deposition or sputtering deposition, and so on. Subsequently, onto the top surface of the ITO 33, there may be formed with, in turn, the hole injecting layer (HiL) 53 composed of CuPc, the hole transporting layer (HTL) 35 composed of NPB, the electron blocking layer 47 composed of LiF, the first host material layer 41 composed of DPVBi, the second host material layer 43 composed of CBP, the hole blocking layer 45 composed of BCP, the electron transporting layer (ETL) 37 composed of Alq 3, the electron injecting layer (EIL) 57 composed of LiF, and a cathode 39 composed of conductive material.

In which, at least one DSA served for projecting blue light may be mixed into DPVBi of the first host material layer 41, and at least one Ir (PPy) 3 served for projecting green light together with DCM2 served for projecting red light may be mixed into CBP of the second host material layer 43.

Figure 5:
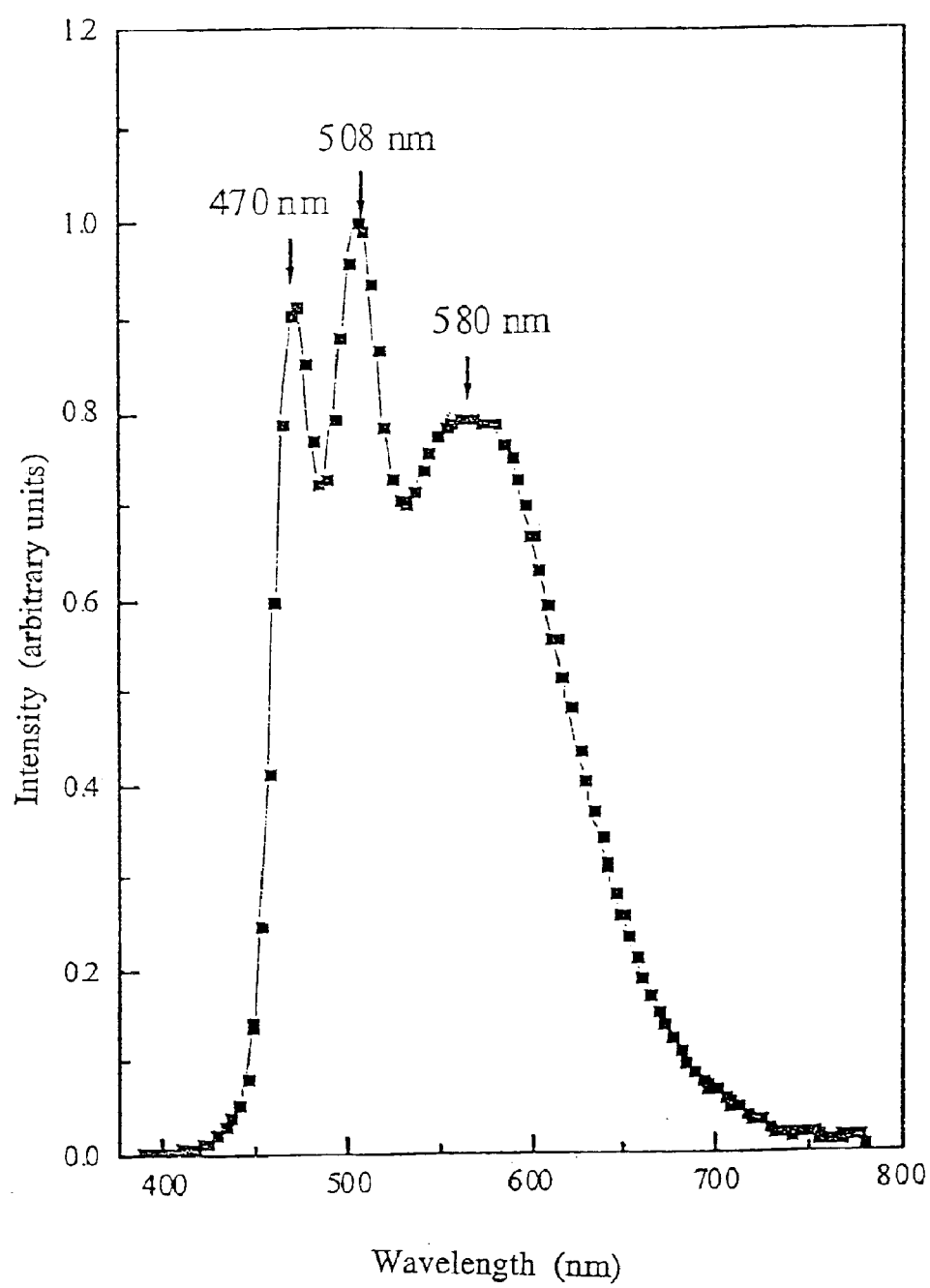
FIG. 5 is a spectrum diagram of the organic electroluminescent device illustrated in FIG. 4 according to the embodiment of the present invention.

With the arrangement for energy levels of aforementioned host material layers (Hosts), the electron-hole pair restricted within the region of the DPVBi 41 and CBP 43 by the blocking effect of the hole blocking layer 45 and electron blocking layer 47 will be generally distributed in each of the host material layers 41, 43. As an external bias voltage is applied, light source with RGB colors may be projected to form a complete three-wavelength projection light source system, and the full-band white light source or full-colored product should be obtained, as illustrated in FIG. 5.

Additionally, in this embodiment, phosphorescence substance Ir (PPy) 3 is used for Guest 2 to project green light in the RGB color system. Not only significantly large percentage of triplet excitons could be utilized well, but also greatly increased luminescence efficiency may be achieved.

Furthermore, in view of the choice for materials, a first phosphorescence substance, such as PtOEP, capable of emitting red light in triplet may be also selected as Guest 1; a second fluorescence substance, such as DSA, capable of projecting blue light in singlet may be selected as Guest 2; and a third fluorescence substance, such as C6, capable of projecting green light in singlet may be selected as Guest 3. Alternatively, a first phosphorescence substance, such Ir (PPy) 3, capable of emitting green light in triplet may be also selected as Guest 1; a second fluorescence substance, such as DSA, capable of projecting blue light in singlet may be selected as Guest 2; and a third fluorescence substance, such as PtOEP, capable of projecting red light in triplet may be selected as Guest 3. Alternatively, a first fluorescence substance, such as DSA, capable of projecting blue light in singlet may be also selected as Guest 1; a second phosphorescence substance, such as Ir (PPy) 3, capable of projecting green light in triplet may be selected as Guest 2; and a third phosphorescence substance, such as PtOEP, capable of projecting red light in triplet may be selected as Guest 3. Thus, the object of respectively projecting three-wavelength RGB colors, i.e., red light, blue light, and green light, when an external bias voltage is applied may be equally achieved.

In the above embodiments, of course, there may be various changes in the selected materials of each layer. The materials disclosed in patents described below are also applicable for reference: for instance, the material of ETL layer or HTL layer may be referred to U.S. Pat. No. 5,294,870, the material of HTL layer may be referred to U.S. Pat. Nos. 5,061,569 and 5,256,945, the material of ETL layer may be referred to U.S. Pat. Nos. 4,539,507 and 5,886,464, the material of HTL layer may be referred to U.S. Pat. Nos. 3,935,031 and 4,356,429, the material of anode may be referred to U.S. Pat. No. 5,773,929, and the material of EIL layer may be referred to U.S. Pat. No. 4,539,507.

To sum up, the present invention is related to a light-emitting device, particularly to an organic electroluminescent device with the feature of three-wavelength luminescence and a method for producing the same. Not only a continuously full-band, full-colored light source featuring three-wavelength may be acquired directly, but also an effective utilization of phosphorescence substance and thus significantly raised luminescence efficiency may be obtained.

The foregoing description is merely one embodiment of present invention and not considered as restrictive. All equivalent variations and modifications in process, method, feature, and spirit in accordance with the appended claims may be made without in any way from the scope of the invention.

LIST OF REFERENCE SYMBOLS

10 organic electroluminescent device (OLED)
11 light-transparent substrate
13 anode
15 hole transporting layer
17 emitting layer
19 cathode
21 substrate
23 anode
25 hole transporting layer
26 emitting layer
261 first emitting layer
262 second emitting layer
27 electron transporting layer
28 exciton blocking layer
29 cathode
295 protecting layer
30 organic electroluminescent device (OLED)
31 substrate
33 first conductive layer
35 hole transporting layer (first carrier blocking layer)
37 second carrier transporting layer
39 cathode (second conductive layer)
41 first host material layer
43 second host material layer
45 first carrier blocking layer
47 second carrier blocking layer
53 first carrier injecting layer
57 second carrier injecting layer

What is claimed is:

1. An organic electroluminescent device, comprising:
   a first conductive layer having a first type of conductivity;
   a first host material layer, placed at the top side of said first conductive layer, having a first guest luminous substance mixed therein for projecting a first color light source under the effect of an external bias voltage;
   a second host material layer, placed at the top side of said first host material layer, having a second guest luminous substance and a third guest luminous substance mixed therein for projecting a second color light source and a third color light source under the effect of said external bias voltage; and
   a second conductive layer having a second type of conductivity, placed at the top side of said second host material layer.

2. An organic electroluminescent device, comprising:
   a first conductive layer having a first type of conductivity;
   a second carrier blocking layer placed at the top side of said first conductive layer;
   a first host material layer, placed at the top side of said second carrier blocking layer, having a first guest luminous substance mixed therein for projecting a first color light source under the effect of an external bias voltage;
   a second host material layer, placed at the top side of said first host material layer, having a second guest luminous substance and a third guest luminous substance mixed therein for projecting a second color light source and a third color light source under the effect of said external bias voltage; and
   a second conductive layer having a second type of conductivity, placed at the top side of said second host material layer.

3. An organic electroluminescent device, comprising:
   a first conductive layer having a first type of conductivity;
   a first host material layer, placed at the top side of said first conductive layer, having a first guest luminous substance mixed therein for projecting a first color light source under the effect of an external bias voltage;
   a second host material layer, placed at the top side of said first host material layer, having a second guest luminous substance and a third guest luminous substance mixed therein for projecting a second color light source and a third color light source under the effect of said external bias voltage;
   a first carrier blocking layer placed at the top side of said second host material layer; and a second conductive layer having a second type of conductivity, placed at the top side of said first carrier blocking layer.

4. The organic electroluminescent device according to claim 3, wherein said first host material layer is a DPVBi layer, and said second host material layer is a CBP layer.

5. The organic electroluminescent device according to claim 3, wherein said first host material layer is a DPVBi layer, and said first guest luminous substance is DSA.

6. The organic electroluminescent device according to claim 3, wherein said second host material layer is a CBP layer, said second guest luminous substance is Ir (PPy) 3, and said third guest luminous is DCM2.

7. The organic electroluminescent device according to claim 3, wherein said first guest luminous substance is selected from the group consisting of fluorescence substance, phosphorescence substance, or the combination thereof.

8. The organic electroluminescent device according to claim 3, wherein said second guest luminous substance is selected from the group consisting of fluorescence substance, phosphorescence substance, or the combination thereof.

9. The organic electroluminescent device according to claim 3, wherein said third guest luminous substance is selected from the group consisting of fluorescence substance, phosphorescence substance, or the combination thereof.

10. An organic electroluminescent device, comprising:
a first conductive layer having a first type of conductivity;
a second carrier blocking layer placed at the top side of said first conductive layer;
a first host material layer, placed at the top side of said second carrier blocking layer, having a first guest luminous substance mixed therein for projecting a first color light source under the effect of an external bias voltage;
a second host material layer, placed at the top side of said first host material layer, having a second guest luminous substance and a third guest luminous substance mixed therein for projecting a second color light source and a third color light source under the effect of said external bias voltage;
a first carrier blocking layer placed at the top side of said second host material layer; and
a second conductive layer having a second type of conductivity, placed at the top side of said first carrier blocking layer.

11. An organic electroluminescent device, comprising:
a first conductive layer having a first type of conductivity;
a second host material layer, placed at the top side of said first conductive layer, having a second guest luminous substance and a third guest luminous substance mixed therein for projecting a second color light source and a third color light source under the effect of an external bias voltage;
a first host material layer, placed at the top side of said second host material layer, having a first guest luminous substance mixed therein for projecting a first color light source under the effect of said external bias voltage; and
a second conductive layer having a second type of conductivity, placed at the top side of said first host material layer.

12. An organic electroluminescent device, comprising:
a first conductive layer having a first type of conductivity;
a first carrier transporting layer placed at the top side of said first conductive layer;
a second carrier blocking layer placed at the top side of said first carrier transporting layer;
a second host material layer, placed at the top side of said second carrier blocking layer, having a second guest luminous substance and a third guest luminous substance mixed therein for projecting a second color light source and a third color light source under the effect of an external bias voltage;
a first host material layer, placed at the top side of said second host material layer, having a first guest luminous substance mixed therein for projecting a first color light source under the effect of said external bias voltage;
a first carrier blocking layer placed at the top side of said first host material layer; and
a second conductive layer having a second type of conductivity, placed at the top side of said first carrier blocking layer.

13. An organic electroluminescent device, comprising:
an anode;
a hole transporting layer placed at the top side of said anode;
an electron blocking layer placed at the top side of said hole transporting layer;
a first host material layer, placed at the top side of said electron blocking layer, having a first guest luminous substance mixed therein for projecting a first color light source under the effect of an external bias voltage;
a second host material layer, placed at the top side of said first host material layer, having a second guest luminous substance and a third guest luminous substance mixed therein for projecting a second color light source and a third color light source under the effect of said external bias voltage;
a hole blocking layer placed at the top side of said second host material layer;
an electron transporting layer placed at the top side of said hole blocking layer; and
a cathode placed at top side of said electron transporting layer.

14. The organic electroluminescent device according to claim 13, wherein the bottom side of said anode is further placed with a light-transparent substrate.

15. The organic electroluminescent device according to claim 13, wherein said first color light source is blue, said second color light source is green, and said third light source is red.

16. The organic electroluminescent device according to claim 13, wherein said first guest luminous substance, said second guest luminous substance, and said third guest luminous substance are selected from the group consisting of fluorescence substance, phosphorescence substance, or the combination thereof, respectively.

17. The organic electroluminescent device according to claim 13, wherein said hole blocking layer is a BCP layer.

18. The organic electroluminescent device according to claim 13, wherein said electron blocking layer is a LiF layer.

19. An organic electroluminescent device, comprising:
a light-transparent substrate;
an anode placed at the top side of said light-transparent substrate;

a hole injecting layer placed at the top side of said anode;

a hole transporting layer placed at the top side of said hole injecting layer;

a DPVBi layer, placed at the top side of said hole transporting layer, having a DSA mixed therein for projecting a blue light source under the effect of an external bias voltage;

a CBP layer, placed at the top side of said DPVBi layer, having Ir (PPy) 3 and DCM2 mixed therein for projecting a green light source and a red light source under the effect of said external bias voltage;

an electron transporting layer placed at the top side of said CBP layer;

an electron injecting layer placed at the top side of said electron transporting layer; and a cathode placed at top side of said electron injecting layer.

20. The organic electroluminescent device according to claim 19, wherein said hole injecting layer is a CuPc layer.

21. The organic electroluminescent device according to claim 19, wherein said electron injecting layer is an Alq layer.

22. An organic electroluminescent device, comprising:

a first conductive layer having a first type of conductivity;

a first host material layer, placed at the top side of said first conductive layer, having a phosphorescence substance mixed therein for projecting a red light;

a second host material layer, placed at the top side of said first host material layer, having a second fluorescence substance and a third phosphorescence substance mixed therein for projecting a blue light and a green light, respectively; and a second conductive layer having a second type of conductivity, placed at the top side of said second host material layer.

23. An organic electroluminescent device, comprising:

a first conductive layer having a first type of conductivity;

a first host material layer, placed at the top side of said first conductive layer, having a phosphorescence substance mixed therein for projecting a green light;

a second host material layer, placed at the top side of said first host material layer, having a second fluorescence substance and a third phosphorescence substance mixed therein for projecting a blue light and a red light, respectively; and a second conductive layer having a second type of conductivity, placed at the top side of said second host material layer.

24. An organic electroluminescent device, comprising:

a first conductive layer having a first type of conductivity;

a first host material layer, placed at the top side of said first conductive layer, having a fluorescence substance mixed therein for projecting a blue light;

a second host material layer, placed at the top side of said first host material layer, having a second phosphorescence substance and a third phosphorescence substance mixed therein for projecting a green light and a red light, respectively; and a second conductive layer having a second type of conductivity, placed at the top side of said second host material layer.

* * * * *